(12) United States Patent
Ramberg

(10) Patent No.: US 6,500,676 B1
(45) Date of Patent: Dec. 31, 2002

(54) METHODS AND APPARATUS FOR DEPOSITING MAGNETIC FILMS

(75) Inventor: Randy J. Ramberg, Roseville, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/933,361

(22) Filed: Aug. 20, 2001

(51) Int. Cl.$^7$ ................................................ H01L 21/00
(52) U.S. Cl. .............. 438/3; 438/1; 438/2; 204/192.11; 204/298.04; 204/298.06; 204/192.13; 204/598.04
(58) Field of Search ........................ 204/192.11, 298.04, 204/298.06, 192.13, 598.04; 438/1–3

(56) References Cited

U.S. PATENT DOCUMENTS

| | | | |
|---|---|---|---|
| 4,731,757 A | 3/1988 | Daughton et al. | 365/173 |
| 4,780,848 A | 10/1988 | Daughton et al. | 365/173 |
| 4,851,095 A | 7/1989 | Scobey et al. | 204/192.12 |
| 5,496,759 A | 3/1996 | Yue et al. | 437/52 |
| 5,525,199 A | 6/1996 | Scobey | 204/192.26 |
| 5,569,617 A | 10/1996 | Yeh et al. | 437/48 |
| 5,616,224 A | 4/1997 | Boling | 204/298.8 |
| 5,656,138 A | 8/1997 | Scobey et al. | 204/294.12 |
| 5,714,009 A | 2/1998 | Boling | 118/723 |
| 5,849,162 A | 12/1998 | Bartolomei et al. | 204/192.13 |
| 6,183,614 B1 | 2/2001 | Fu | 204/298.2 |
| 6,190,511 B1 * | 2/2001 | Wei | 204/192.11 |
| 6,214,183 B1 * | 4/2001 | Maishev et al. | 204/298.04 |
| 6,235,169 B1 * | 5/2001 | Gopalraja et al. | 204/298.06 |
| 6,238,537 B1 * | 5/2001 | Kahn et al. | 204/598.04 |
| 6,280,579 B1 * | 8/2001 | Lee et al. | 204/192.13 |

OTHER PUBLICATIONS

N. Boling et al., "A High Rate Reactive Sputtering Process for Batch, In–line, or Roll Coaters", Deposition Sciences, Inc., Santa Rosa, California, dated prior to Aug. 20, 2001, 4 pages.
Deposition Sciences Inc., "Microdyn Sputtering System 60000 Series", dated prior to Aug. 20, 2001, 4 pages.
Deposition Sciences Inc., "Microdyn Sputtering System 40000 Series", dated prior to Aug. 20, 2001, 4 pages.
http://www.depsci.com/div_edg/display.html, "DSI: Engineering Development Group Home", downloaded Mar. 13, 2001, 1 page.

* cited by examiner

Primary Examiner—John F. Niebling
Assistant Examiner—Olivia Luk
(74) Attorney, Agent, or Firm—Crompton, Seager & Tufte, LLC

(57) ABSTRACT

Methods and systems are provided for depositing a magnetic film using one or more long throw magnetrons, and in some embodiments, an ion assist source and/or ion beam source. The long throw magnetrons are used to deposit particles at low energy and low pressure, which can be useful when, for example, depositing interfacial layers or the like. An ion assist source can be added to increase the energy of the particles provided by the long throw magnetrons, and/or modify or clean the layers on the surface of the substrate. An ion beam source can also be added to deposit layers at a higher energies and lower pressures to, for example, provide layers with increased crystallinity. By using a long throw magnetron, an ion assist source and/or an ion beam source, magnetic films can be advantageously provided.

47 Claims, 11 Drawing Sheets

METHODS AND APPARATUS FOR DEPOSITING MAGNETIC FILMS

FIELD OF THE INVENTION

The present invention generally relates to methods and systems for depositing thin films, and more particularly, to methods and systems for depositing thin magnetic films.

BACKGROUND OF THE INVENTION

Magnetic films are used in many diverse applications. Some applications include, for example, data storage applications such as Magnetic Random Access Memories (MRAM), magnetic disk memories, magnetic tape storage systems, magnetic strip readers, etc. Other applications include magnetic sensor applications. In each of these applications, a magnetic film in some form is typically used. The magnetic film can include a single layer or multiple layers. To provide the desired functionality, some magnetic films include both magnetic and non-magnetic layers, and sometimes metallic and non-metallic (e.g. dielectric) layer. For example, in MRAM applications, AMR, Giant MagnetoResistive (GMR), and sometimes Colossal MagnetoResistive (CMR) films are used. One such MRAM magnetic film is shown and described in U.S. Pat. No. 5,569,617 to Yeh et al.

A number of process techniques are currently used to form magnetic films, including Molecular Beam Epitaxy (MBE), Plasma Vapor Deposition (PVD) and Ion Beam Deposition (IBD). MBE is useful for depositing layers at very low energy, which can produce pseudo epitaxial layers. PVD is useful for depositing layers at a higher energy, which can produce layers that have, for example, good current carrying capabilities. IBD is useful for depositing layers at still higher energy and reduced pressures, which can produce layers with higher crystallinity. To date, however, long throw magnetrons have not been used to form magnetic films to considerable disadvantage.

SUMMARY OF THE INVENTION

The present invention provides methods and apparatus for depositing a magnetic film using one or more long throw magnetrons, and in some embodiments, an ion assist source and/or ion beam source. The long throw magnetrons can deposit particles at low energy and low pressure, which can be used to, for example, deposit interfacial layers or the like. In some embodiments of the present invention, an ion assist source is also used with the long throw magnetrons to increase the energy of the particles provided by the long throw magnetron, and/or modify or clean the layers on the surface of the substrate. An ion beam source may also be used, sometimes separately from the long throw magnetrons and/or ion assist source and other times in conjunction therewith. The ion beam source can be used to deposit layers at a higher energy and lower pressure to, for example, provide layers with increased crystallinity. By using a long throw magnetron, an ion assist source and/or ion beam source together or separately, certain magnetic films can be advantageously provided.

In one illustrative embodiment, a vacuum chamber is provided with one or more long throw magnetrons therein. Each magnetron has a magnetron target. The substrate is held in place by a substrate carrier that is spaced a long throw distance from the one or more long throw magnetrons. This spacing helps keep the substrate out of the high energy plasma region produced by the long throw magnetrons, and also reduces the magnetic field in the vicinity of the substrate that is produced by the long throw magnetrons. Both of these can be important when making high grade magnetic films. Each long throw magnetron preferably produces ions that are directed to a corresponding magnetron target, which then sputters particles from the corresponding magnetron target to the substrate to form one or more magnetic layers. The one or more magnetrons may be activated together or separately, depending on the application.

Because some magnetic films, such as GMR films, include layers that are formed from several different materials, it is contemplated that selected magnetron targets may be formed from different material systems. By selecting an appropriate magnetron, a desired material can then be deposited on the substrate. By sequencing the various long throw magnetrons, a desired sequence of layers can be deposited.

It is recognized that some layers may require a mixture of target materials. For these layers, two or more magnetrons may be in activation simultaneously. For example, activating three magnetrons, one with Ni target, another with a Co target, and yet another with a Fe target, a NiCoFe permalloy layer may be deposited. The relative concentration of each target material can be controlled by controlling the power that is provided to each magnetron. The relative power can control the deposition rate of each constituent target material. It is contemplated that the relative concentration of the target materials can be homogenous or inhomogeneous through the deposited layer, as desired.

Long throw magnetrons are well suited for depositing materials at low energy and low pressure, which can be particularly useful in depositing interfacial layers or the like. For higher energy deposition, however, it is contemplated that an ion assist source may also be provided in the vacuum chamber. The ion assist source can provide assist ions in and around the substrate. The assist ions can be used for a variety of purposes, including for example, adding energy to the particles provided by the one or more long throw magnetrons, cleaning and/or modifying a layer that is deposited by the one or more of the long throw magnetrons, etc. The ion assist source can be activated before, during, or after the one or more long throw magnetrons are activated, depending on the application at hand. In addition, multiple ion assist sources can be provided if desired.

To deposit layers at even a higher energy, an ion beam source may be provided. As is known, ion beam deposition can provide higher energy deposition at lower pressures, which for some materials, can increase the crystallinity of the layer. In a preferred embodiment, the ion beam source is used to produce layers or portions of layers that are more suited to ion beam deposition. The ion beam source can be activated before, during, or after the one or more long throw magnetrons are activated, and/or before, during, or after the ion assist source is activated, depending on the application at hand. In addition, multiple ion beam sources may be provided, if desired.

For some applications, it may be desirable to set a magnetic direction of one or more of the layers of the magnetic film. To accommodate this, a magnetic field source may be provided near the substrate. In some embodiments, the magnetic field source is activated to provide a setting magnetic field at the substrate, preferably during the deposition of selected layers of the magnetic film.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
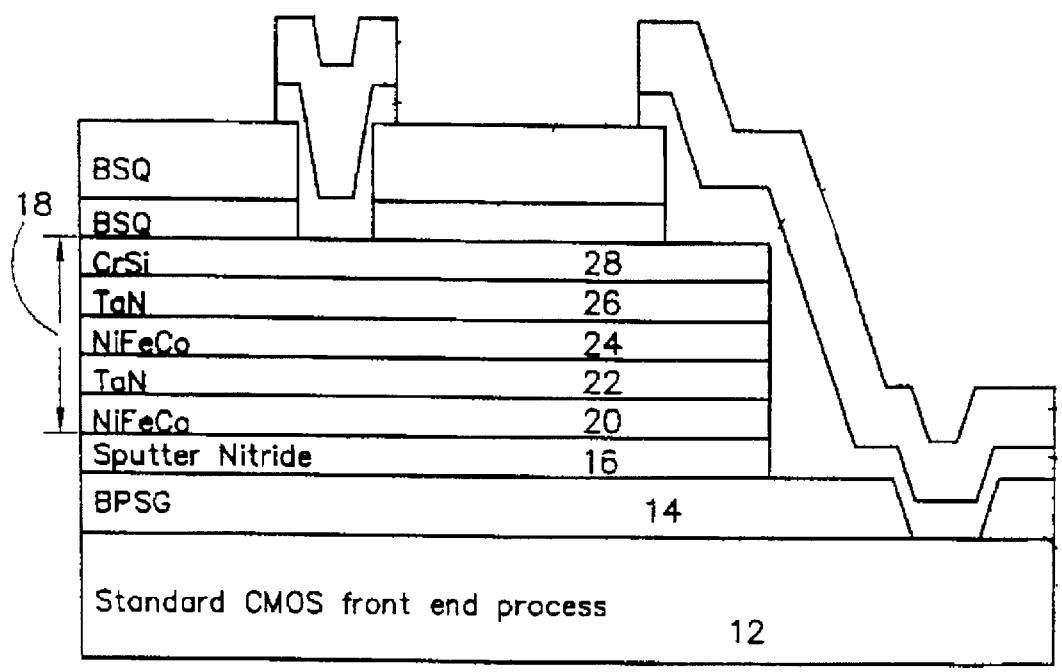
FIG. 1 is a cross-sectional side view of a conventional magnetic film having a number of layers.

FIG. 1 is a cross-sectional side view of a magnetic film having a number of layers. The magnetic film shown in FIG. 1 is a GMR type film, and is only provided as an example of a magnetic film that can be formed using the present invention. It should be understood that the present invention is not limited to forming GMR type magnetic films as shown, but rather can be used to form any type of magnetic film, depending on the application.

A CMOS wafer is shown at 12, which has been processed using normal front-end IC processing. Depending on the thickness of the standard oxide provided on the CMOS wafer 12, additional oxide may be added such as BPSG layer 14. A diffusion barrier layer 16 of silicon nitride may then be sputter deposited, as shown. Next, a magnetic stack 18 is deposited. Magnetic stack 18 is a sandwich-type structure containing a first layer 20 of a NiFeCo (Permalloy), a non-magnetic intermediate layer 22 of tantalum nitride (TaN), another layer 24 of Permalloy, another non-magnetic resistive layer 26 of TaN, and a capping or etch stop layer 28 of Chromium silicon (CrSi). The deposition of Permalloy layers 20 and 24 is preferably done in the presence of a 25 Oersted setting magnetic field. A further discussion of the magnetic film shown in FIG. 1 can be found in U.S. Pat. No. 5,496,759 to Yue et al. To form the best films, all of the depositions of magnetic stack 18 should be performed in-situ, that is, in a single sputter deposition system.

Figure 2:
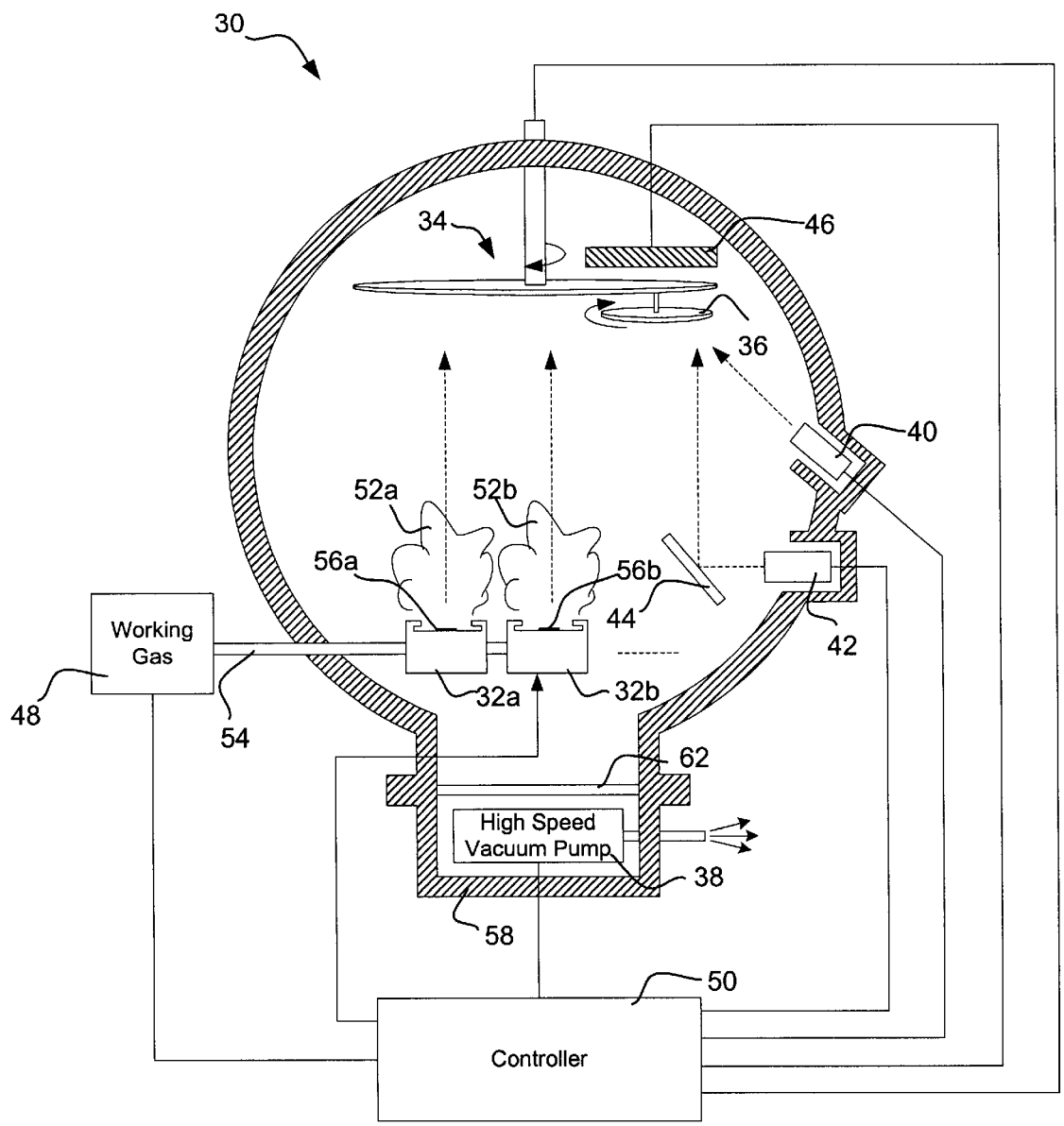
FIG. 2 is a schematic view of an illustrative system for depositing magnetic films in accordance with the present invention.

FIG. 2 is a schematic view of an illustrative system for depositing magnetic films in accordance with the present invention. The illustrative system includes a vacuum chamber generally shown at 30. The vacuum chamber 30 includes one or more long throw magnetron assemblies 32a and 32b, a planetary substrate holder 34 with a plurality of rotatable planets 36, a high speed vacuum pump 38, an ion assist source 40, an ion beam source 42 with an ion beam target 44, and a setting magnetic field generator 46. A working gas source 48 may also be provided to selectively provide a working gas to the long throw magnetrons 32a and 32b. A controller 50 is used to control the long throw magnetron assemblies 32a and 32b, the planetary substrate holder 34, the high speed vacuum pump 38, the ion assist source 40, the ion beam source 42, the setting magnetic field generator 46 and the working gas source 48.

The magnetron assemblies 32a and 32b are connected to the working gas source 48 by a conduit 54. In general, the vacuum chamber 30 is filled with an inert gas, which is then ionized to form a low energy plasma, such as low energy plasma regions 52a and 52b. Each magnetron assembly 32a and 32b has a corresponding magnetron target 56a and 56b, as shown. When a long throw magnetron is activated, such as long throw magnetron 32a, the corresponding magnetron target 56a is charged to a negative potential in the range of 400 to 900 volts which has the effect of bombarding the magnetron target 56a with energetic charged ions, which sputters atomic or molecular particles from the magnetron target 56a. The sputtered particles then condense on the substrate, which in the illustrative embodiment, is positioned on the planet 36. DC sputtering is typically used to sputter metallic materials. RF sputtering, which utilizes oscillating target voltages with a net zero DC current, is typically used to sputter dielectric materials.

Another approach for sputtering particles using long throw magnetrons is reactive DC sputtering. In reactive DC sputtering, reactive gas(es) are added to the vacuum chamber 30 to form a compound film at the substrate. Using this approach, it is desirable to have the reaction take place on the substrate and not at the magnetron targets 56a and 56b, as a severe reduction in deposition rate as well as an increase in target arcing may take place if the magnetron target 56a and 56b becomes covered with a reactive dielectric species. To help reduce these effects, the magnetron targets 56a and 56b and the substrates are often isolated from one another, where the reactive gas pressure at the magnetron targets 56a and 56b is maintained at a lower level to prevent target "poisoning", and the reactive gas pressure is kept high at the substrate to effect reaction.

In the illustrative embodiment, the vacuum chamber 30 may have a sleeve 58, which opens into the main vacuum chamber 60. The sleeve 58 may contain a high speed vacuum pump 38 with a gate valve 62 located between the sleeve 58 and the main vacuum chamber 60. The vacuum pump 38 can be used to lower and maintain the pressure in the main vacuum chamber 60 at a very low level in the working gas pressure, preferably below about $1.5 \times 10^{-4}$ Torr. The vacuum pump 38 may differentially pump out the working gas near the long throw magnetrons such that there is a lower pressure of the working gas in the vicinity of the substrate (e.g. less than $1.5 \times 10^{-4}$ Torr) than is present at the magnetron targets 56a and 56b (e.g. greater than $1.5 \times 10^{-4}$ Torr).

The magnetron assemblies 32a and 32b are preferably in vertical alignment with the axis of rotation of the planetary substrate holder 34. In addition, the throw or distance between the top of the magnetron assemblies 32a and 32b and the planet 36 is preferably greater than 7 inches, and more preferably greater than about 10 inches. This distance or spacing between the magnetron assemblies 32a and 32b and the planet 36 helps keep the substrates out of the high energy plasma regions 52a and 52b of the long throw magnetron assemblies 32a and 32b. This distance or spacing can also reduce the magnitude of the magnetic field (produced by the long throw magnetron assemblies 32a and 32b) that is present in the vicinity of the substrates.

It is contemplated that the various magnetron targets 56a and 56b may be formed from different materials or material systems. When so provided, a layer of a one material can be deposited on the substrate by selecting an appropriate magnetron. A layer of another material can then be deposited on the substrate by selecting another magnetron. To deposit a layer that includes a mixture of target materials, two or more magnetrons may be in activation simultaneously. For example, to deposit a NiCoFe permalloy layer, three separate magnetrons may be activated including a first magnetron with a Ni target, a second magnetron with a Co target, and a third magnetron with a Fe target. The relative concentration of each target material can be controlled by controlling the power that is provided to each selected magnetron 32a and 32b, as the relative power can control the deposition rate of each constituent target material. It is contemplated that the relative concentration of target materials can be homogenous or inhomogeneous across the deposited layer, as desired.

Long throw magnetrons are well suited for depositing materials at low energy and low pressure, which can be particularly useful in depositing interfacial layers or the like. For higher energy deposition, however, an ion assist source 40 may be provided. The ion assist source 30 can provide assist ions in and around the substrate, and can be used for a variety of purposes. The assist ions can be used to, for example, clean and/or modify a layer that is deposited by the one or more of the long throw magnetrons 32a and 32b. The assist ions may also be used to add energy to the particles provided by the one or more long throw magnetrons 32a and 32b. The ion assist source 40 can be activated before, during, or after the one or more long throw magnetrons 32a and 32b are activated, depending on the application at hand. In addition, more than one ion assist source can be provided, if desired.

To deposit materials at even higher energy, an ion beam source 42 and ion beam target 44 may be provided in the vacuum chamber 30. Ion beam deposition can provide higher energy deposition at lower pressures than long throw magnetrons, which for some materials, can increase the crystallinity of the deposited layer. In a preferred embodiment, the ion beam source 42 is used to produce layers or portions of layers that are more suited to ion beam deposition. The ion beam source 42 can be activated before, during, or after the one or more long throw magnetrons 32a and 32b are activated, and/or before, during, or after the ion assist source 40 is activated, depending on the application at hand. In addition, more than one ion beam source and ion beam target can be provided, if desired.

For some applications, it may be desirable to set the magnetic direction of one or more of the layers of the magnetic film. To accommodate this, a magnetic field source generator 46 may be provided, preferably adjacent to the substrate. In some embodiments, the magnetic field source generator 46 provides a setting magnetic field at the substrate, preferably during the deposition of selected layers of the magnetic film.

Figure 3:
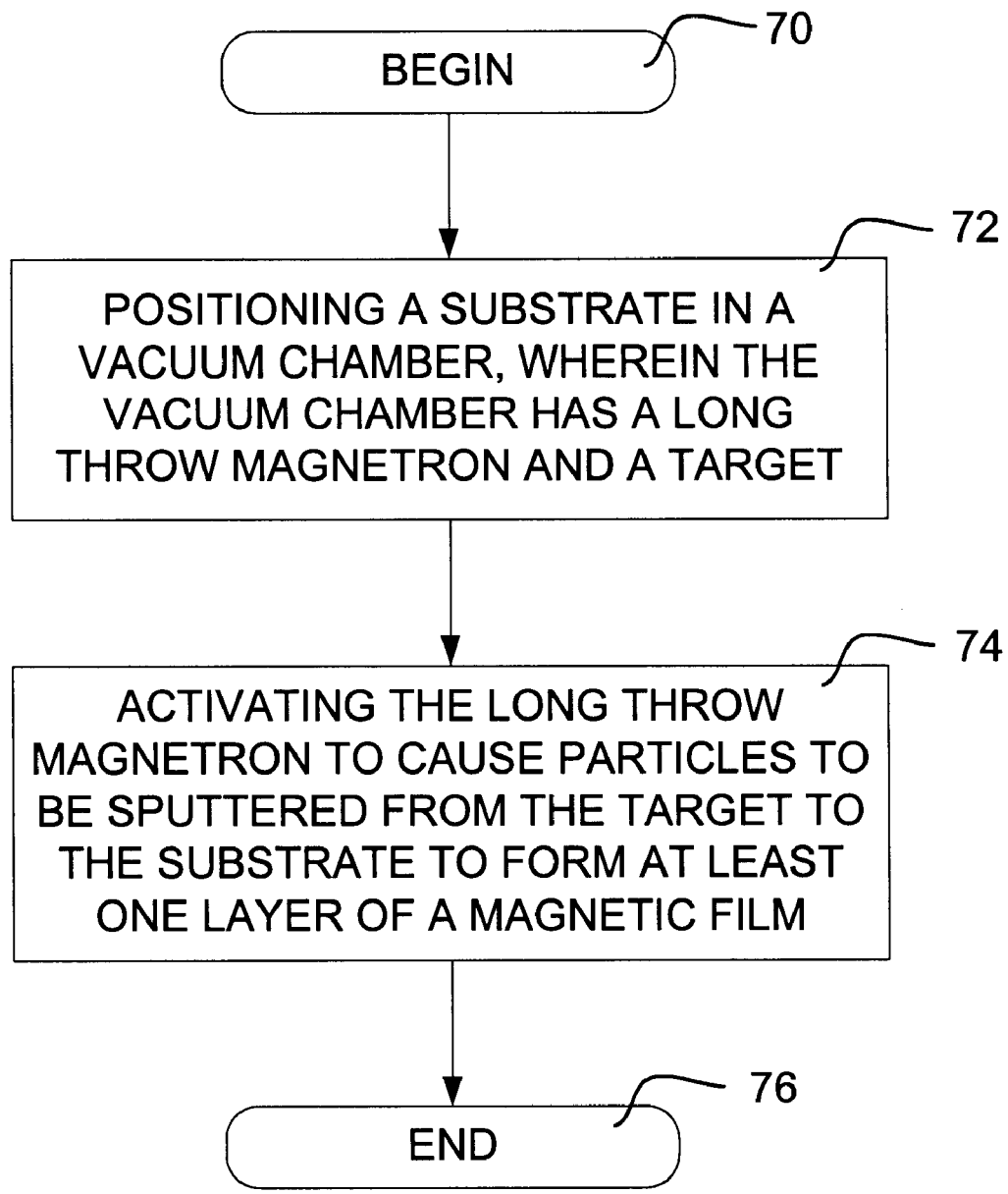
FIG. 3 is a flow diagram showing an illustrative method in accordance with the present invention.

FIG. 3 is a flow diagram showing an illustrative method in accordance with the present invention. This method illustrates one method of forming one or more layers of a magnetic film using a long throw magnetron. The method is entered at step 70, and control is passed to step 72. Step 72 positions a substrate in a vacuum chamber, wherein the vacuum chamber has a long throw magnetron and a magnetron target. Step 74 activates the long throw magnetron to cause particles to be sputtered from the magnetron target to the substrate to form at least one layer of a magnetic film. Control is passed to step 76, wherein the method is exited.

Figure 4:
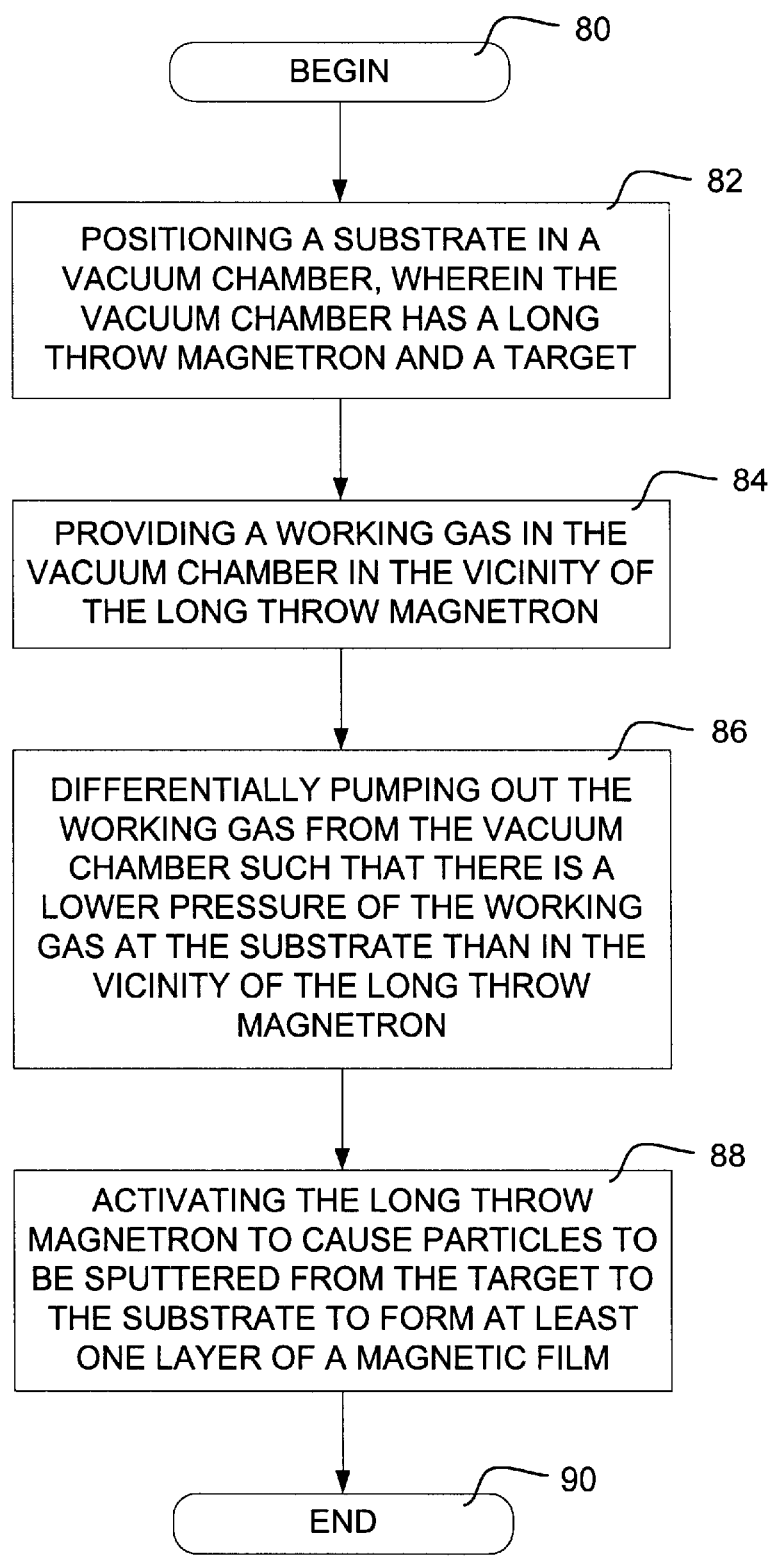
FIG. 4 is a flow diagram showing another illustrative method in accordance with the present invention.

FIG. 4 is a flow diagram showing another illustrative method in accordance with the present invention. The method is entered at step 80, and control is passed to step 82. Step 82 positions a substrate in a vacuum chamber, wherein the vacuum chamber has a long throw magnetron and a target therein. Control is then passed to 84. Step 84 provides a working gas in the vacuum chamber in the vicinity of the long throw magnetron. Control is then passed to step 86. Step 86 differentially pumps out the workings gas from the vacuum chamber such that there is a lower pressure of the working gas at the substrate than in the vicinity of the long throw magnetron. Control is then passed to step 88. Step 88 activates the long throw magnetron to cause particles to be sputtered from the target to the substrate to form at least one layer of a magnetic film. Control is passed to step 90, wherein the method is exited.

Figure 5:
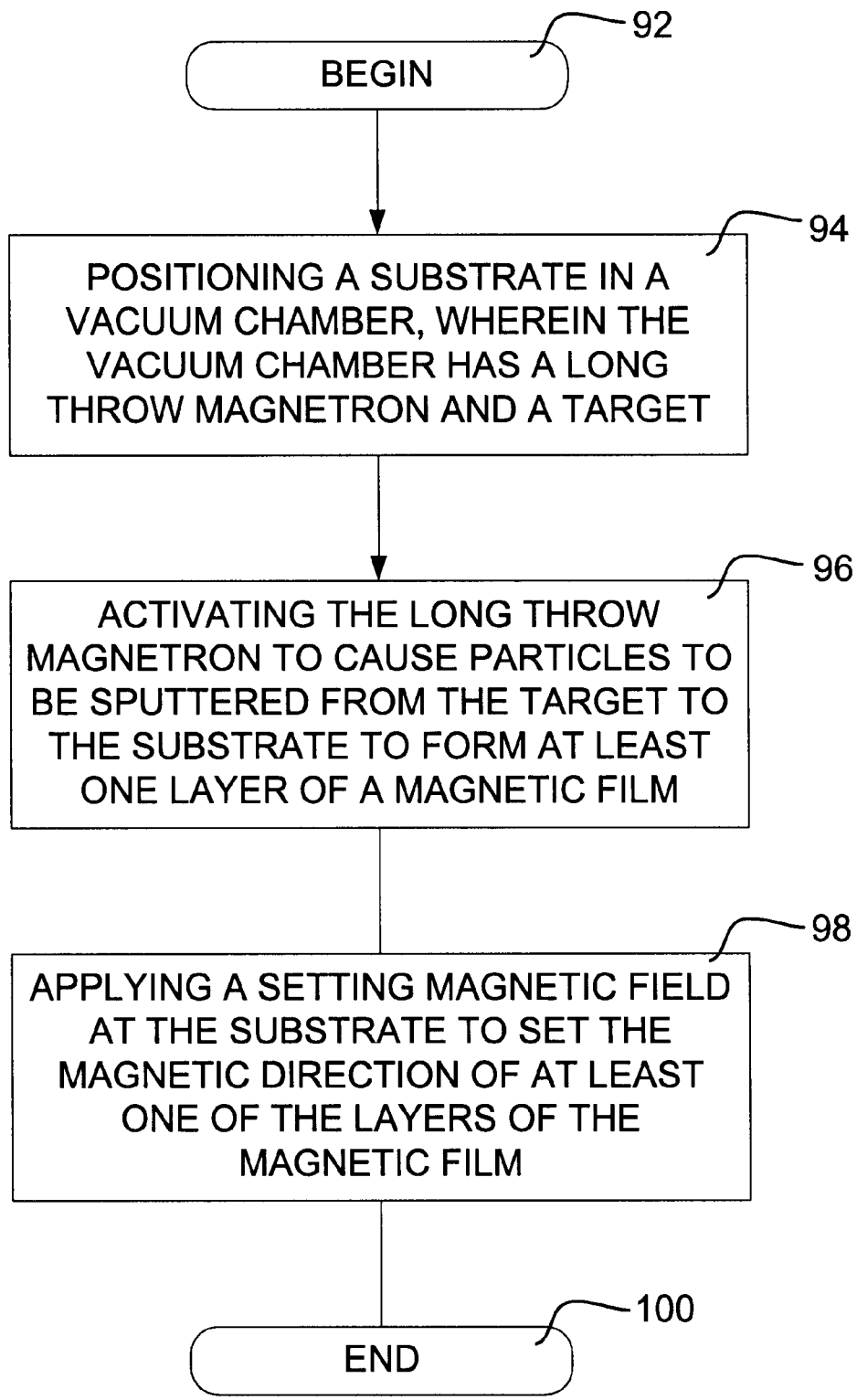
FIG. 5 is a flow diagram showing yet another illustrative method in accordance with the present invention.

FIG. 5 is a flow diagram showing yet another illustrative method in accordance with the present invention. This method is entered at step 92, and control is passed to step 94. Step 94 positions a substrate in a vacuum chamber, wherein the vacuum chamber has a long thrown magnetron and a magnetron target. Control is then passed to step 96. Step 96 activates the long throw magnetron to cause particles to be sputtered from the target to the substrate to form at least one layer of a magnetic film. Control is then passed to step 98. Step 98 applies a setting magnetic field to the substrate to set the magnetic direction of at least one of the layers of the magnetic film. The setting magnetic film is preferably applied while selected layers of the magnetic film are deposited. Control is then passed to step 100, wherein the method is exited.

Figure 6:
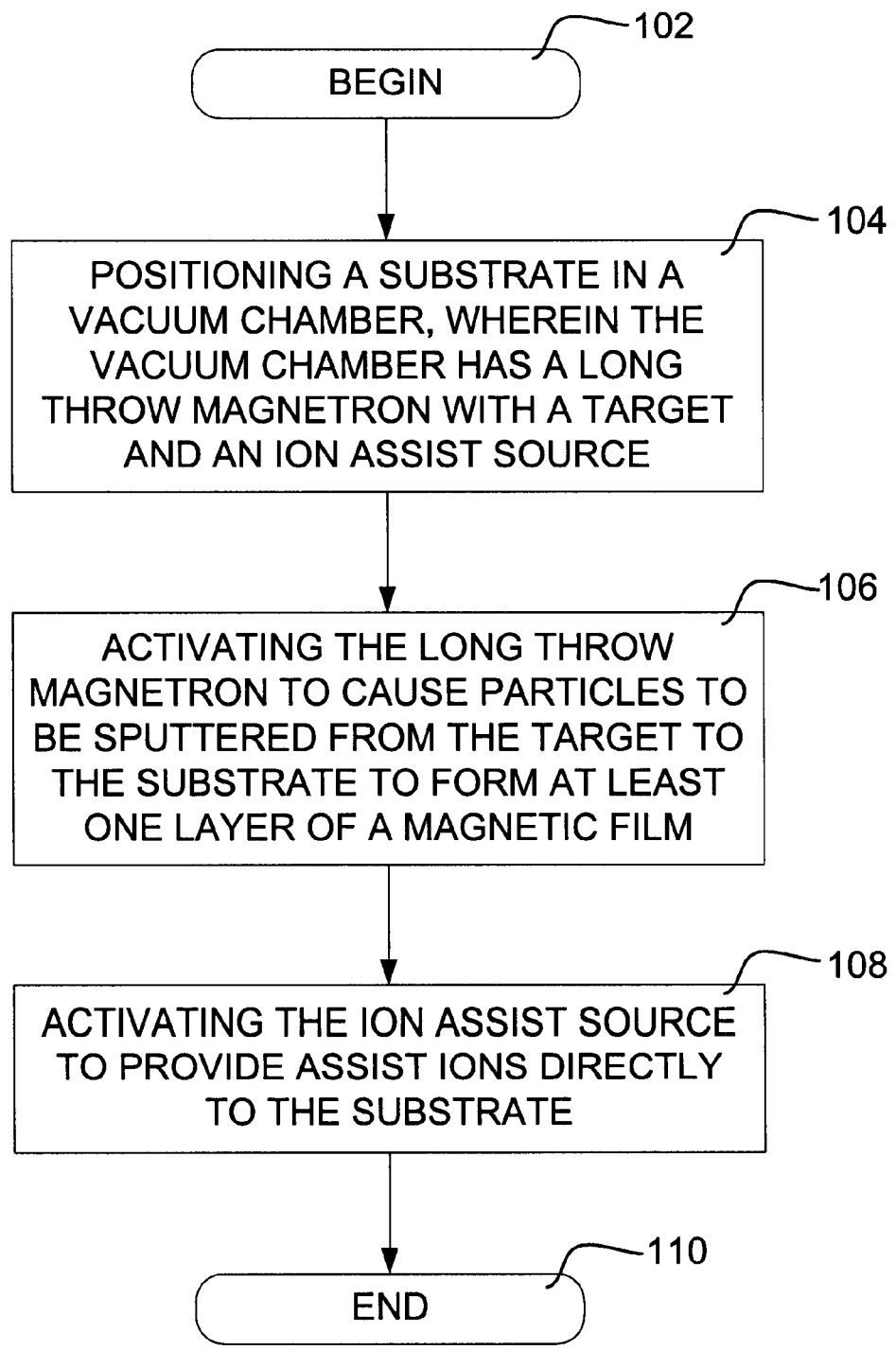
FIG. 6 is a flow diagram showing another illustrative method in accordance with the present invention.

FIG. 6 is a flow diagram showing another illustrative method in accordance with the present invention. This method is entered at step 102, and control is passed to step 104. Step 104 positions a substrate in a vacuum chamber, wherein the vacuum chamber has a long throw magnetron with a magnetron target and an ion assist source. Step 106 activates the long throw magnetron to cause particles to be sputtered from the magnetron target to the substrate to form at least one layer of a magnetic film. Control is then passed to step 108. Step 108 activates the ion assist source to provide assist ions directly to the substrate. The ion assist source may be used in conjunction with the long throw magnetrons to increase the energy of the particles provided by the long throw magnetrons, and/or modify or clean the layers on the surface of the substrate. As further described below with reference to FIG. 7, the ion assist source can be activated before, during, or after the long throw magnetron.

Figure 7:
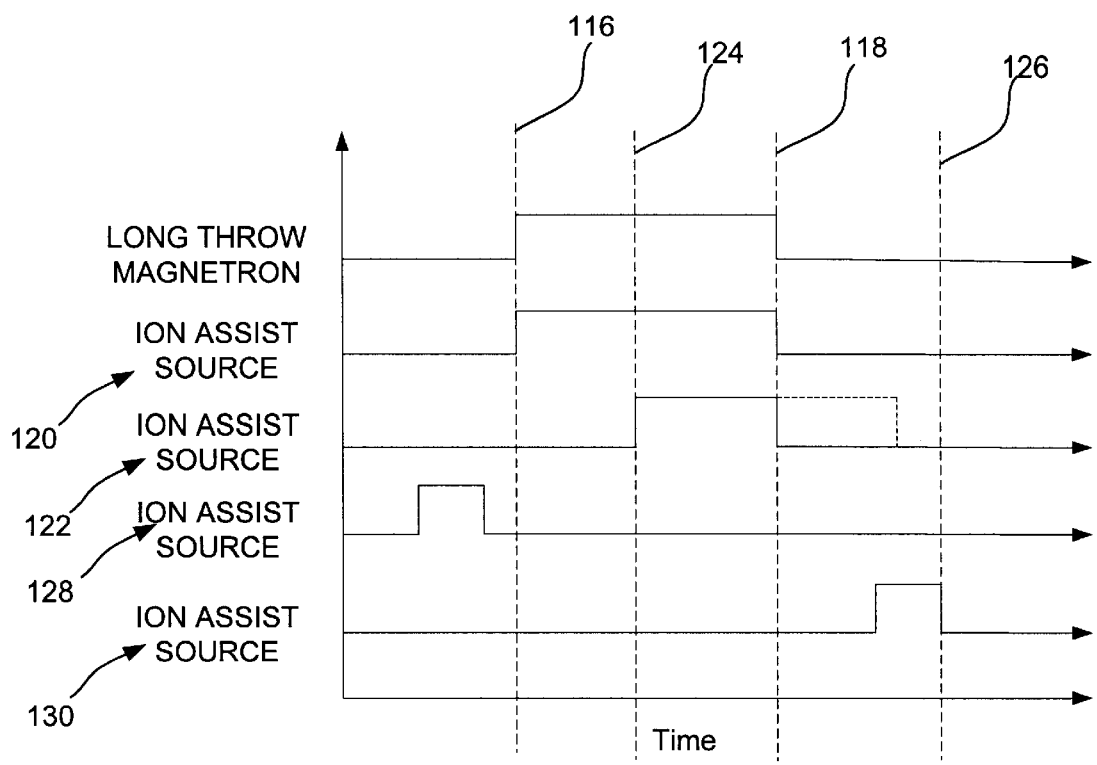
FIG. 7 is a timing diagram showing illustrative timing relationships between the activation of the one or more long throw magnetrons and the ion assist source.

FIG. 7 is a timing diagram showing illustrative timing relationships between the activation of one of the long throw magnetrons 32a and the ion assist source 40. The long throw magnetron 32a is activated at time 116 and deactivated at time 118. In one illustrative embodiment, and as generally shown at 120, the ion assist source 40 may be activated and deactivated at the same time as the long throw magnetron. In this embodiment, the ion assist ions may be provided to, for example, add energy to the particles that are sputtered by the long throw magnetron 32a. This may be useful for deposit material at a higher energy than is possible with just the long throw magnetron.

In another illustrative embodiment, and as generally shown at 122, the ion assist source 40 may be activated at time 124 and deactivated at time 118, or alternatively at time 126. In this embodiment, the long throw magnetron may deposit one or more layers at a lower energy, followed by the deposition of one or more layers at a higher energy with the aid of the ion assist source 40. As indicated by the dashed line, the ion assist source 40 may remain activated until time 126, which is after the long throw magnetron 32a is deactivated. This may allow the ion assist source 40 to modify and/or clean one or more layers deposited by the long throw magnetron 32a.

In another illustrative embodiment, and as generally shown at 128, the ion assist source 40 may be activated and deactivated before the long throw magnetron is activated. In this embodiment, the ion assist source 40 may be used to, for example, clean the surface of the substrate before the long throw magnetron 32a deposits one or more layers.

In another illustrative embodiment, and as generally shown at 130, the ion assist source 40 may be activated and deactivated after the long throw magnetron is deactivated. In this embodiment, the ion assist source 40 may be used to, for example, modify and/or clean the surface of the substrate after the long throw magnetron 32a deposits one or more layers. It should be recognized that the timing relationships shown in FIG. 7 are only illustrative, and that other timing relationships are contemplated depending on the particular application at hand.

Figure 8:
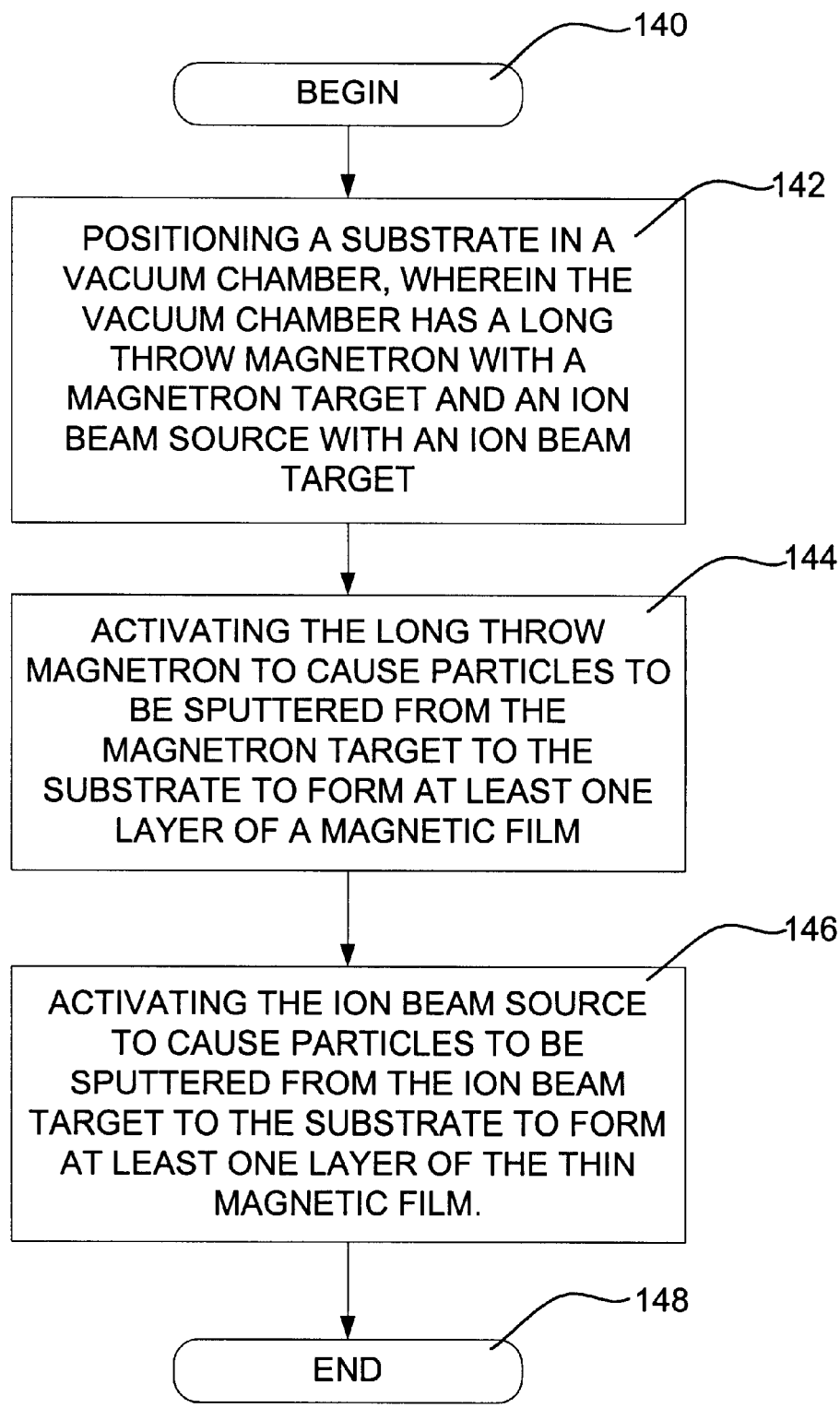
FIG. 8 is a flow diagram showing another illustrative method in accordance with the present invention.

FIG. 8 is a flow diagram showing another illustrative method in accordance with the present invention. In this embodiment, an ion beam source is added. The method is entered at step 140, and control is passed to step 142. Step 142 positions a substrate in a vacuum chamber, wherein the vacuum chamber has a long throw magnetron with a magnetron target and an ion beam source with an ion beam target. Step 144 activates the long throw magnetron to cause particles to be sputtered from the magnetron target to the substrate to form at least one layer of a desired magnetic film. Step 146 activates the ion beam source to cause particles to be sputtered from the ion beam target to the substrate to form at least one other layer of the thin magnetic film. Control is then passed to step 148, wherein the method is exited.

Figure 9:
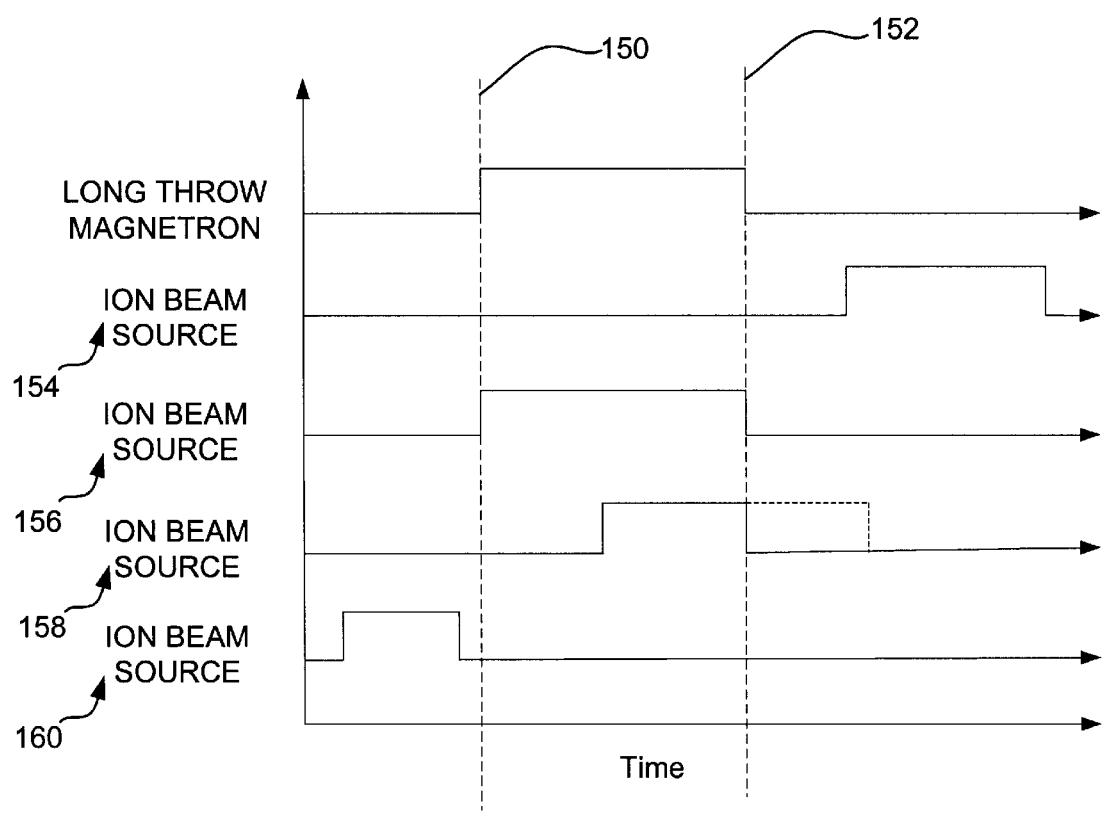
FIG. 9 is a timing diagram showing illustrative timing relationships between the activation of the one or more long throw magnetrons and the ion beam source.

FIG. 9 is a timing diagram showing illustrative timing relationships between the activation of the long throw magnetron 32a and the ion beam source 42. The long throw magnet 32a is activated at time 150 and deactivated at time 152. In one illustrative embodiment, and as generally shown at 154, the ion beam source 42 may be activated and deactivated after the long throw magnetron 32a is deactivated. In this embodiment, the ion beam source 42 may be used to, for example, deposit another layer after the long throw magnetron 32a has deposited a layer. In one illustrative embodiment, the layer deposited by the ion beam source 42 is of the same material type as the layer deposited by the long throw magnetron 32a. When so provided, the long throw magnetron 32a may be used to, for example, provide an initial or interfacial layer of a material at a lower energy, and the ion beam source 42 may be subsequently activated to deposit the bulk of the layer at a higher energy, which as described above, may improve the crystallinity of the bulk of the layer.

In another illustrative embodiment, the ion beam source 42 and the long throw magnetron 32a may deposit different types of materials. When so provided, the long throw magnetron 32a may, for example, help deposit a permalloy layer, such as a NiFeCo permalloy layer as shown at 20 in FIG. 1. Thereafter, the ion mean source 42 may activated to deposit a dielectric layer, such as dielectric layer TaN 22 of FIG. 1.

In another illustrative embodiment, and as generally shown at 156, the ion beam source 42 may be activated and deactivated at the same time as the long throw magnetron 32a. In one illustrative embodiment, the material deposited by the ion beam source 42 is the same material type as the material deposited by the long throw magnetron 32a. When so provided, the ion beam source 42 may help increase the deposition rate. In another illustrative embodiment, the material deposited by the ion beam source 42 is different from the material deposited by the long throw magnetron 32a. In this embodiment, a mixture of the two materials may be deposited.

In another illustrative embodiment, and as generally shown at 158, the ion beam source 42 may be activated after the long throw magnetron 32a is activated, and deactivated at the same time as the long throw magnetron is deactivated. In this embodiment, one or more layers may be deposited at a lower energy using only the long throw magnetron 32a, followed by the deposition of one or more layers at a higher energy with the ion beam source 42. In one embodiment, the layer deposited by the ion beam source 42 may be the same material type as the layer deposited by the long throw magnetron 32a. When so provided, the long throw magnetron 32a may be used to, for example, provide an initial or interfacial layer of material at a lower energy. Then, the ion beam source 42 may be activated to help deposit the bulk of the layer at a higher energy. In another embodiment, the layer deposited by the ion beam source 42 may be a different material than the material deposited by the long throw magnetron 32a. When so provided, the long throw magnetron 32a may deposit, for example, one or more layers of a first material type followed by the deposition of one or more layers that have a mixture of the first material type and a second material type.

As indicated by the dashed line, the ion beam source 42 may remain activated after the long throw magnetron 32a is deactivated. This may allow the ion beam source 42 to continue to deposit one or more additional layers, and/or modify and/or clean one or more of the layers on the surface of the substrate.

In another illustrative embodiment, and as generally shown at 160, the ion beam source 42 is activated and deactivated before the long throw magnetron 32a is activated. In this embodiment, the ion beam source 42 may be used to, for example, deposit a layer before the long throw magnetron 32a deposits a layer. The layer deposited by the ion beam source 42 may be the same material or a different material as the layer deposited by the long throw magnetron 32a. When the ion beam source 42 and the long throw magnetron 32a deposit different materials, the ion beam source 42 may be used to, for example, deposit a dielectric layer (such as dielectric layer TaN 22 of FIG. 1) and the long throw magnetron 32a may deposit or help to deposit a permalloy layer (such as the NiFeCo permalloy layer 24 of FIG. 1).

Figure 10:
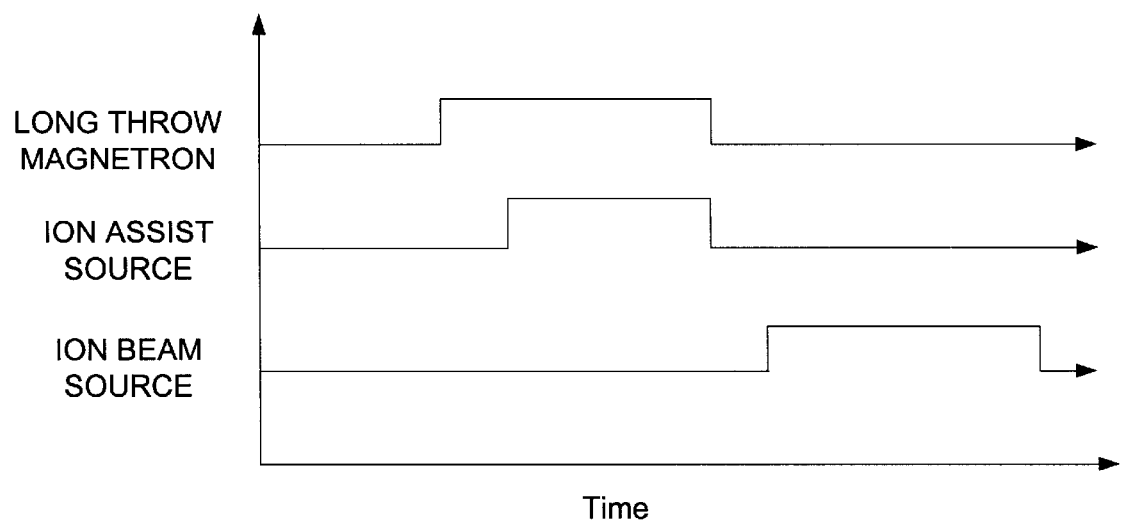
FIG. 10 is a timing diagram showing an illustrative timing relationship between the activation of the one or more long throw magnetrons, the ion assist source, and the ion beam source.

FIG. 10 is a timing diagram showing an illustrative timing relationship between the activation of a long throw magnetron 32a, an ion assist source 40, and an ion beam source 42. In the illustrative embodiment, the long throw magnetron 32a is activated first. While the long throw magnetron is active, the ion assist source 40 is activated. Both the long throw magnetron 32a and the ion assist source 40 are deactivated at about the same time. Then, the ion beam source 42 is activated and subsequently deactivated. In one illustrative embodiment, this timing relationship may be used to, for example, form a desired magnetic film as follows: the long throw magnetron 32a first deposits one or more initial or interfacial layers at a low energy; then, the ion assist source 40 is activated to provide assist ions to form one or more layers at a higher energy; and finally, the ion beam source 42 is activated to deposit the bulk of the film at a higher energy.

Figure 11:
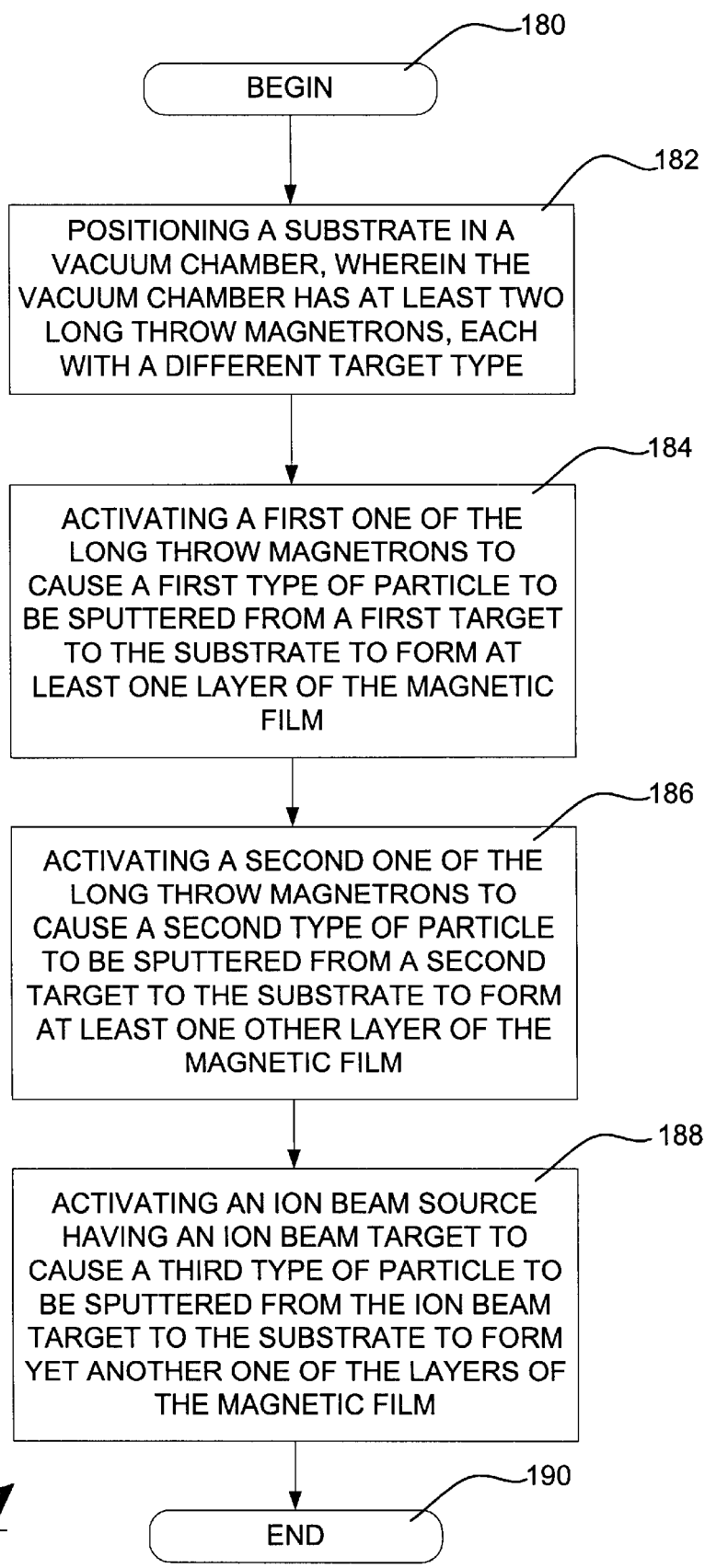
FIG. 11 is a flow diagram showing yet another illustrative method in accordance with the present invention.

FIG. 11 is a flow diagram showing yet another illustrative method in accordance with the present invention. This illustrative method illustrates the use of two long throw magnetrons and an ion beam source. The method is entered at step 180, and control is passed to step 182. Step 182 positions a substrate in a vacuum chamber, wherein the vacuum chamber has at least two long throw magnetrons, and an ion beam source. In this illustrative embodiment, each long throw magnetron has a different target material type. Control is then passed to step 184. Step 184 activates a first one of the long throw magnetrons to cause a first material to be sputtered from a first target to the substrate to form at least one layer of the magnetic film. Control is then passed to step 186. Step 186 activates a second one of the long throw magnetrons to cause a second material type to be sputtered from a second target to the substrate to form at least one other layer of the magnetic film. Control is then passed to step 188. Step 188 activates an ion beam source having an ion beam target to cause a third type of particle to be sputtered from the ion beam target to the substrate to form yet another one of the layers of the magnetic film. Control is then passed to step 190, wherein the method is exited.

Having thus described the preferred embodiments of the present invention, those of skill in the art will readily appreciate that the teachings found herein may be applied to yet other embodiments within the scope of the claims hereto attached.

What is claimed is:

1. A method for forming a magnetic film having one or more layers on a substrate, the method comprising the steps of:
    positioning a substrate in a vacuum chamber, wherein the vacuum chamber has a long throw magnetron and a target therein; and
    activating the long throw magnetron to cause particles to be sputtered from the target to the substrate to form at least one layer of the magnetic film.

2. A method according to claim 1, wherein the long throw magnetron produces an high energy plasma, and wherein the substrate is positioned at a sufficient distance from the long throw magnetron to be outside of the high energy plasma.

3. A method according to claim 2, wherein the substrate is positioned at least 7 inches from the long throw magnetron.

4. A method according to claim 2, wherein the substrate is positioned at least 10 inches from the long throw magnetron.

5. A method according to claim 1, further comprising the steps of:
    providing a working gas in the vacuum chamber in the vicinity of the long throw magnetron; and
    differentially pumping out the working gas from the vacuum chamber such that there is a lower pressure of the working gas at the substrate than in the vicinity of the long throw magnetron.

6. A method according to claim 5, wherein the pressure of the working gas in the vacuum chamber at the substrate is less than $5 \times 10^{-4}$ Torr.

7. A method according to claim 6, wherein the pressure of the working gas in the vacuum chamber in the vicinity of the long throw magnetron is greater than $5 \times 10^{-4}$ Torr.

8. A method according to claim 1, further comprising the step of:
    applying a setting magnetic field at the substrate to set the magnetic direction of at least one of the layers of the magnetic film.

9. A method according to claim 1, wherein the vacuum chamber further includes an ion assist source, the method further comprising the step of:
    activating the ion assist source to provide assist ions directly to the substrate.

10. A method according to claim 9, wherein the assist ions add energy to the particles that are sputtered from the target of the long throw magnetron.

11. A method according to claim 9, wherein the ion assist source and the long throw magnetron are in activation at the same time.

12. A method according to claim 9, wherein the ion assist source is activated after the long throw magnetron is activated.

13. A method according to claim 12, wherein the ion assist source is activated to modify one or more layers deposited by the long throw magnetron.

14. A method according to claim 12, wherein the ion assist source is activated to clean one or more layers deposited by the long throw magnetron.

15. A method according to claim 1, wherein the vacuum chamber further includes an ion beam source and ion beam target, the ion beam source providing ions to the ion beam target to cause particles to be sputtered from the ion beam target to the substrate, the method further comprising the step of:
    activating the ion beam source to cause particles to be sputtered from the ion beam target to the substrate to form at least one layer of the magnetic film.

16. A method according to claim 15, wherein the ion beam source is activated after the long throw magnetron is deactivated.

17. A method according to claim 15, wherein the at least one layer deposited by the long throw magnetron is a metallic layer, and the at least one layer deposited by the ion beam source is a dielectric layer.

18. A method according to claim 17, wherein the metallic layer is a permalloy layer.

19. A method according to claim 15, wherein the at least one layer deposited by the long throw magnetron is a metallic layer, and the at least one layer deposited by the ion beam source is also a metallic layer.

20. A method according to claim 15, wherein the at least one layer deposited by the long throw magnetron is a dielectric layer, and the at least one layer deposited by the ion beam source is also a dielectric layer.

21. A method according to claim 10 wherein the vacuum chamber further includes an ion beam source and ion beam target, the ion beam source providing ions to the ion beam target to cause particles to be sputtered from the ion beam target to the substrate, the method further comprising the step of:
    activating the ion beam source to cause particles to be sputtered from the ion beam target to the substrate to form at least one layer of the magnetic film.

22. A method according to claim 21, wherein the ion assist source is activated after the long throw magnetron is activated.

23. A method according to claim 22, wherein the ion beam source is activated after the ion assist source is activated.

24. A method according to claim 23, wherein the ion beam source, the ion assist source, and long throw magnetron are in activation at the same time.

25. A method according to claim 23, wherein the ion beam source is activated after the ion assist source and long throw magnetron are deactivated.

26. A method for forming a film having at least two strata or layers, the method comprising the steps of:

positioning a substrate in a vacuum chamber, wherein the vacuum chamber has a long throw magnetron and a ion beam source;

activating the long throw magnetron to cause particles to be sputtered from a first target to the substrate to form a first layer of the film;

deactivating the long throw magnetron;

activating the ion beam source to cause particles to be sputtered from a second target to the substrate to form a second layer of the film; and deactivating the ion beam source.

27. A method according to claim 26, wherein the long throw magnetron is deactivated before the ion beam source is activated.

28. A method according to claim 26, wherein the long throw magnetron is deactivated after the ion beam source is activated.

29. A method according to claim 26, wherein the particles sputtered from the first target are metallic particles.

30. A method according to claim 29, wherein the particles sputtered from the second target are dielectric particles.

31. A method according to claim 26, further comprising the step of:

activating an ion assist source while the long throw magnetron is activated to add energy to the particles that are sputtered from the first target by the long throw magnetron.

32. A method according to claim 31, wherein the long throw magnetron and the ion assist source are deactivated before the ion beam source is activated.

33. A method for forming a magnetic film having two or more layers on a substrate, the method comprising the steps of:

positioning a substrate in a vacuum chamber, wherein the vacuum chamber has at least two long throw magnetrons, each with a different target type; and activating a first one of the long throw magnetrons to cause a first type of particles to be sputtered from a first target to the substrate to form at least one layer of the magnetic film; and activating a second one of the long throw magnetrons to cause a second type of particles to be sputtered from a second target to the substrate to form at least one other layer of the magnetic film.

34. A method according to claim 33, further comprising the step of:

activating an ion beam source having an ion beam target to cause a third type of particles to be sputtered from the ion beam target to the substrate to form yet another one of the layers of the magnetic film.

35. A method for forming a film having one or more layers on a substrate, the method comprising the steps of:

positioning a substrate in a vacuum chamber, wherein the vacuum chamber has a long throw magnetron and a target therein, and wherein the substrate is positioned at least 7 inches from the long throw magnetron; and activating the long throw magnetron to cause particles to be sputtered from the target to the substrate to form at least one layer of the film.

36. A method for forming a film having one or more layers on a substrate, the method comprising the steps of:

positioning a substrate in a vacuum chamber, wherein the vacuum chamber has a long throw magnetron and a target therein;

providing a working gas in the vacuum chamber in the vicinity of the long throw magnetron;

differentially pumping out the working gas from the vacuum chamber such that there is a lower pressure of the working gas at the substrate than in the vicinity of the long throw magnetron, the pressure of the working gas in the vacuum chamber at the substrate being less than $5 \times 10^{-4}$ Torr and the pressure of the working gas in the vicinity of the long throw magnetron being greater than $5 \times 10^{-4}$ Torr; and activating the long throw magnetron to cause particles to be sputtered from the target to the substrate to form at least one layer of the magnetic film.

37. A method for forming a magnetic film having one or more layers on a substrate, the method comprising the steps of:

positioning a substrate in a vacuum chamber, wherein the vacuum chamber has a long throw magnetron, a target and an ion assist source;

activating the long throw magnetron to cause particles to be sputtered from the target to the substrate to form at least one layer of the magnetic film; and activating the ion assist source to provide assist ions directly to the substrate.

38. A method according to claim 37, wherein the ion assist source is activated after the long throw magnetron is activated.

39. A method according to claim 38, wherein the ion assist source is activated to modify one or more layers deposited by the long throw magnetron.

40. A method according to claim 38, wherein the ion assist source is activated to clean one or more layers deposited by the long throw magnetron.

41. A method for forming a film having two or more layers on a substrate, the method comprising the steps of:

positioning a substrate in a vacuum chamber, wherein the vacuum chamber has a long throw magnetron, a target, an ion beam source and an ion beam target, the ion beam source configured to provide ions to the ion beam target to cause particles to be sputtered from the ion beam target to the substrate;

activating the long throw magnetron to cause particles to be sputtered from the target to the substrate to form at least one layer of the film;

deactivating the long throw magnetron; and activating the ion beam source to cause particles to be sputtered from the ion beam target to the substrate to form at least one other layer of the film.

42. A method for forming a film having one or more layers on a substrate, the method comprising the steps of:

positioning a substrate in a vacuum chamber, wherein the vacuum chamber has a long throw magnetron, a long throw target, an ion assist source, an ion beam source and an ion beam target therein, wherein the ion assist source is configured to add energy to the particles that are sputtered from the long throw magnetron, and wherein the ion beam source is configured to provide ions to the ion beam target to cause particles to be sputtered from the ion beam target to the substrate;

activating the long throw magnetron to cause particles to be sputtered from the target to the substrate to form at least one layer of the film;

activating the ion assist source to provide assist ions directly to the substrate; and activating the ion beam source to cause particles to be sputtered from the ion beam target to the substrate to form at least one layer of the film.

43. A method according to claim 42, wherein the ion assist source is activated after the long throw magnetron is activated.

44. A method according to claim 42, wherein the ion beam source is activated after the ion assist source is activated.

45. A method according to claim 42, wherein the ion beam source, ion assist source and long throw magnetron are in activation at the same time.

46. A method according to claim 45, wherein the ion beam source is activated after the ion assist source and long throw magnetron are deactivated.

47. A method for forming a film having one or more layers on a substrate, the method comprising the steps of:

positioning a substrate in a vacuum chamber, wherein the vacuum chamber has a long throw magnetron, a target and an ion assist source;

activating the long throw magnetron to cause particles to be sputtered from the target to the substrate to form at least one layer of the film; and activating the ion assist source, after the long throw magnetron is activated, to provide assist ions directly to the substrate.

\* \* \* \* \*